United States Patent
Qiu et al.

(10) Patent No.: US 12,040,259 B2
(45) Date of Patent: Jul. 16, 2024

(54) III-NITRIDE-BASED SEMICONDUCTOR PACKAGED STRUCTURE AND METHOD FOR MANUFACTURING THE SAME

(71) Applicant: INNOSCIENCE (SUZHOU) SEMICONDUCTOR CO., LTD., Suzhou (CN)

(72) Inventors: Shangqing Qiu, Suzhou (CN); Lei Zhang, Suzhou (CN); Kai Cao, Suzhou (CN); King Yuen Wong, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 497 days.

(21) Appl. No.: 17/417,121

(22) PCT Filed: Mar. 10, 2021

(86) PCT No.: PCT/CN2021/080042
§ 371 (c)(1),
(2) Date: Jun. 22, 2021

(87) PCT Pub. No.: WO2022/188071
PCT Pub. Date: Sep. 15, 2022

(65) Prior Publication Data
US 2023/0036009 A1 Feb. 2, 2023

(51) Int. Cl.
*H01L 23/495* (2006.01)
*H01L 21/02* (2006.01)
(Continued)

(52) U.S. Cl.
CPC .. *H01L 23/49534* (2013.01); *H01L 21/02389* (2013.01); *H01L 23/291* (2013.01); *H01L 2021/60277* (2013.01)

(58) Field of Classification Search
None
See application file for complete search history.

(56) References Cited

U.S. PATENT DOCUMENTS 6,750,546 B1 6/2004 Villanueva et al.
9,666,538 B1 * 5/2017 Bolognia ............ H01L 23/5389
(Continued)

FOREIGN PATENT DOCUMENTS

CN 1374696 A 10/2002
CN 1499623 A 5/2004
(Continued)

OTHER PUBLICATIONS

International Search Report and Written Opinion of the corresponding PCT application No. PCT/CN2021/080042 mailed on Dec. 8, 2021.
(Continued)

*Primary Examiner* — Evren Seven
*Assistant Examiner* — Cole Leon Lindsey
(74) *Attorney, Agent, or Firm* — JCIPRNET

(57) ABSTRACT

A III-nitride-based semiconductor packaged structure includes a lead frame, an adhesive layer, a III-nitride-based die, an encapsulant, and at least one bonding wire. The lead frame includes a die paddle and a lead. The die paddle has first and second recesses arranged in a top surface of the die paddle. The first recesses are located adjacent to a relatively central region of the top surface. The second recesses are located adjacent to a relatively peripheral region of the top surface. The first recess has a shape different from the second recess from a top-view perspective. The adhesive layer is disposed on the die paddle to fill into the first recesses. The III-nitride-based die is disposed on the adhesive layer. The encapsulant encapsulates the lead frame and the III-nitride-based die. The second recesses are filled with
(Continued)

the encapsulant. The bonding wire is encapsulated by the encapsulant.

18 Claims, 10 Drawing Sheets

(51) Int. Cl.
 *H01L 21/60* (2006.01)
 *H01L 23/29* (2006.01)

(56) References Cited

U.S. PATENT DOCUMENTS

| | | | |
|---|---|---|---|
| 2008/0032456 A1* | 2/2008 | Ahn | H01L 25/105 |
| | | | 438/109 |
| 2009/0152691 A1* | 6/2009 | Nguyen | H01L 24/97 |
| | | | 257/667 |
| 2009/0294932 A1* | 12/2009 | Sahasrabudhe | H01L 23/49548 |
| | | | 257/666 |
| 2012/0146192 A1* | 6/2012 | Han | H01L 23/49582 |
| | | | 257/E29.022 |
| 2014/0284784 A1 | 9/2014 | Yasunaga et al. | |
| 2019/0393138 A1 | 12/2019 | Milo et al. | |
| 2020/0211933 A1 | 7/2020 | Raposas et al. | |

FOREIGN PATENT DOCUMENTS

| | | |
|---|---|---|
| CN | 1574330 A | 2/2005 |
| CN | 101355074 A | 1/2009 |
| CN | 100576525 C | 12/2009 |
| CN | 101604679 A | 12/2009 |
| CN | 101601133 B | 8/2011 |
| CN | 202094114 U | 12/2011 |
| CN | 202120898 U | 1/2012 |
| CN | 102768959 A | 11/2012 |
| CN | 104979323 A | 10/2015 |
| CN | 105514078 A | 4/2016 |
| CN | 106981470 A | 7/2017 |
| CN | 210837732 U | 6/2020 |
| KR | 20010044948 A | 6/2001 |

OTHER PUBLICATIONS

First Office Action of the corresponding China patent application No. 202180000921.6 mailed on Dec. 13, 2021.

* cited by examiner

III-NITRIDE-BASED SEMICONDUCTOR PACKAGED STRUCTURE AND METHOD FOR MANUFACTURING THE SAME

FIELD OF THE INVENTION

The present invention generally relates to a semiconductor packaged structure. More specifically, the present invention relates to a III-nitride-based semiconductor packaged structure having a lead frame with multiple recesses for improving the fixation strength of the packaged structure.

BACKGROUND OF THE INVENTION

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

III-nitride-based devices such as those described above operate at higher power and substantially higher frequency than prior art devices. As such, they generate more heat than silicon-based or GaAs-based devices. The increased heat output of III-nitride-based devices results in thermal cycling that can weaken the bond between adhesives and substrates leading to delamination. Thus, III-nitride-based devices have unique packaging needs that take into account the requirement for enhanced thermal dissipation and overcome the potential for packaging degradation caused by III-nitride device heat output. Thus, there is a need in the art for improved III-nitride-based device packages.

SUMMARY OF THE INVENTION

In accordance with one aspect of the present disclosure, a nitride-based semiconductor device is provided. A III-nitride-based semiconductor packaged structure includes a lead frame, an adhesive layer, a III-nitride-based die, an encapsulant, and at least one bonding wire. The lead frame includes a die paddle and at least one lead. The die paddle has a plurality of first recesses and a plurality of second recesses arranged in a top surface of the die paddle. The first recesses are located adjacent to a relatively central region of the top surface. The second recesses are located adjacent to a relatively peripheral region of the top surface, and the first recess has a shape different from the second recess from a top-view perspective. The adhesive layer is disposed on the die paddle to fill into at least one of the first recesses. The III-nitride-based die is disposed on the adhesive layer. The encapsulant encapsulates the lead frame and the III-nitride-based die, in which at least one of the second recesses is filled with the encapsulant. The bonding wire is encapsulated by the encapsulant and electrically connects the III-nitride-based die to the lead.

In accordance with one aspect of the present disclosure, a method for manufacturing a III-nitride-based semiconductor packaged structure is provided. The method includes steps as follows. A plurality of first recesses are formed into a relatively central region of a die paddle. A plurality of second recesses are formed into a relatively peripheral region of the die paddle, in which the first and second recesses have different shapes from a top-view perspective. At least one of the first recesses is filled with an adhesive layer. A III-nitride-based die is disposed on the adhesive layer. A bonding wire is disposed to electrically connect the III-nitride-based die to a lead. The die paddle, the lead, and the III-nitride-based die are encapsulated, so as to fill at least one of the first recesses with an encapsulant.

In accordance with one aspect of the present disclosure, a nitride-based semiconductor device is provided. A III-nitride-based semiconductor packaged structure includes a lead frame, a III-nitride-based die, an adhesive layer, an encapsulant, and at least one bonding wire. The lead frame includes at least one die paddle and at least one lead, in which the die paddle has a plurality of recesses arranged in a top surface of the die paddle. The III-nitride-based die is disposed over the die paddle. The adhesive layer is disposed between the die paddle and the III-nitride-based die and has a plurality of first downward-extending portions within a first group of the recesses and around the III-nitride-based die. The encapsulant encapsulates the lead frame and the III-nitride-based die and has a plurality of second downward-extending portions within a second group of the recesses and around the III-nitride-based die. At least one bonding wire is encapsulated by the encapsulant and electrically connects the III-nitride-based die to the lead.

By applying the above configuration, the top surface of the die paddle with the recesses can have a greater surface area, which will be advantageous to enhance fixation strength of an element/a layer to be placed on the die paddle. In this regard, the greater surface area means there will result in a greater attaching/bonding area, thereby enhancing the fixation strength. Moreover, from a top-view perspective, the first and second recesses can have shapes different from each other, so as to adapt different elements/layers.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
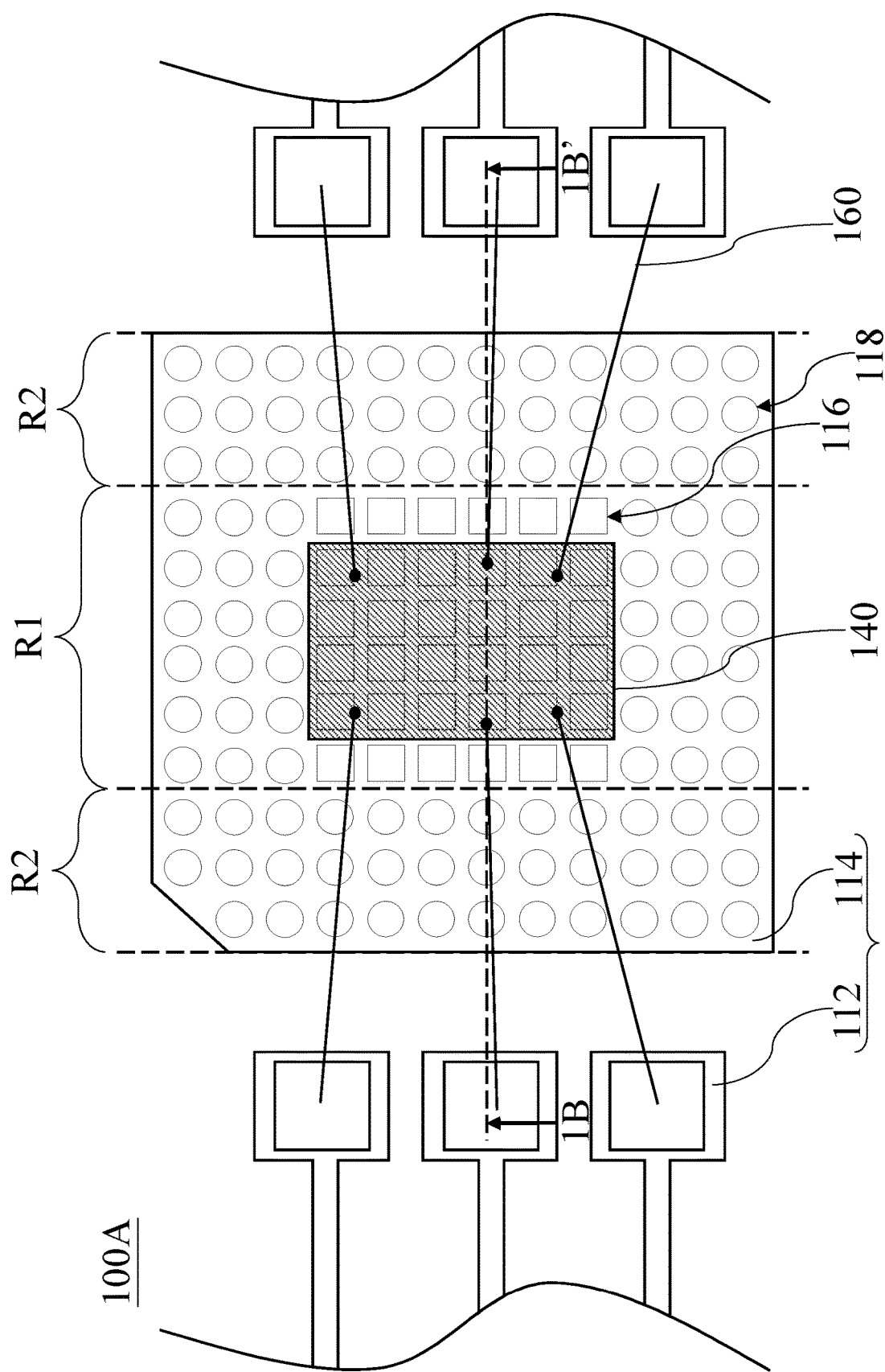
FIG. 1A is a top view of a III-nitride-based semiconductor packaged structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
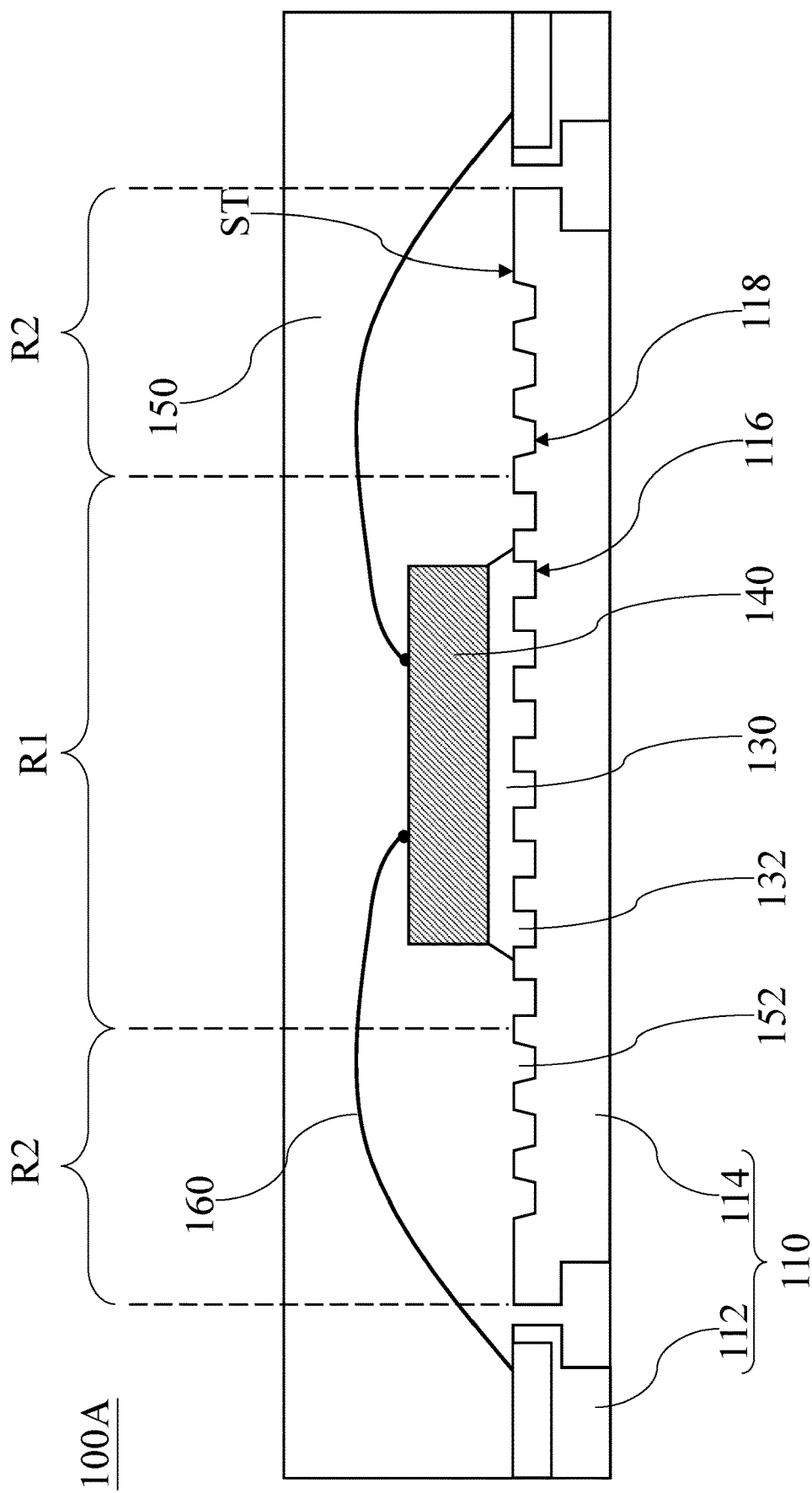
FIG. 1B is a cross-sectional view across a line 1B-1B' of the semiconductor device in FIG. 1A.

FIG. 1A is a top view of a III-nitride-based semiconductor packaged structure 100A according to some embodiments of the present disclosure. FIG. 1B is a cross-sectional view across a line 1B-1B' of the semiconductor device 100A in FIG. 1A. A III-nitride-based semiconductor packaged structure 100A includes a lead frame 110, an adhesive layer 130, a III-nitride-based die 140, an encapsulant 150, and bonding wires 160. As used herein, the term "III-nitride" means GaN, AlN, InN and various mixtures thereof such as AlGaN, InAlGaN and InAlN with various ratios of metal elements in the nitrides.

The lead frame 110 includes leads 112 and a die paddle 114. The leads 112 can be arranged at two opposite sides of the die paddle 114. Each of the leads 112 can include a conductive pad to serve as an electrical connection, which can connect two locations electrically. The die paddle 114 can be made of metal. The die paddle 114 has a top surface ST configured to support a die or a chip. The die paddle 114 can further have a plurality of recesses 116 and 118. The recesses 116 and 118 can be arranged in the top surface ST of the die paddle 114. The recesses 116 and 118 can be formed for improving the yield rate of a package stage for the III-nitride-based semiconductor packaged structure 100A.

During a package stage, elements or layers are disposed and fixed on a die paddle. Then, an encapsulant can be formed on a top surface of the die paddle to encase these elements or layers, thereby achieving the package. The fixation strength of the encapsulant to the die paddle acts as an important factor concerning the yield rate of the package process. For example, once fixation strength of an encapsulant to a die paddle is weak (i.e., not strong enough), the encapsulant might peel off from the die paddle, which means the package fails.

In response to such problems, the recesses 116 and 118 are formed to enhance fixation strength of an element/a layer to be placed on the die paddle 114. The recesses 116 are located adjacent to a relatively central region R1 of the top surface ST of the die paddle 114. The recesses 118 are located adjacent to a relatively peripheral region R2 of the top surface ST of the die paddle 114. The relatively peripheral region R2 surrounds/encloses the relatively central region R1. The relatively central region R1 is a rectangular region. The relatively peripheral region R2 is a ring-shaped region surrounding or enclosing the rectangular region. Therefore, the recesses 118 are arranged to surround or enclose the recesses 116. That is, the recesses 118 can be arranged as being closer to an edge of the top surface ST than the recesses 116.

Compared to an absolutely flat surface, the top surface ST of the die paddle 114 with the recesses 116 and 118 can have a greater surface area, which will be advantageous to enhance fixation strength of an element/a layer to be placed on the die paddle 114. In this regard, the greater surface area means there will result in a greater attaching/bonding area, thereby enhancing the fixation strength. Moreover, from a top-view perspective, each of the recesses 116 has a shape different from each of the recesses 118. In the exemplary illustration of FIG. 1A, the shape of each of the recesses 116 is rectangular, and the shape of each of the recesses 118 is round.

The reason for such arrangement is that: an adhesive layer and a die on the adhesive layer are typically disposed on a relatively central region, and an encapsulant is typically disposed on a relatively peripheral region. Accordingly, the difference between recesses 116 and 118 can fit the different elements/layers.

More specifically, as shown in FIG. 1B, the adhesive layer 130 is disposed on the die paddle 114. The III-nitride-based die 140 is disposed on the adhesive layer 130. The encapsulant 150 is disposed on the die paddle 114. The adhesive layer 130 fills into most of the recesses 116. The encapsulant 150 fills into the rest of the recesses 116 and all of the second recesses 118. In other words, a first group of the recesses 116 is filled with the adhesive layer 130, and a second group of the recesses 116 is filled with the encapsulant 150.

During the package stage, the adhesive layer 130 is placed on the top surface ST of the die paddle 114 and then the III-nitride-based die 140 is placed on the adhesive layer 130. The III-nitride-based die 140 can be downward pressed, such that the III-nitride-based die 140 can be attached/fixed on the top surface ST of the die paddle 114 through the adhesive layer 130. When downward pressing the III-nitride-based die 140, the adhesive layer 130 can be compressed to fill into the first recesses 116. The rectangular first recesses 116 can be easily filled with the adhesive layer 130 because an external force is directly applied to the adhesive layer 130. Also, the rectangular recesses 116 can have a surface area as large as possible. As such, the adhesive layer 130 can have a large contact area with the die paddle 114 and thus can be strongly attached to the die paddle 114, which reduces the possibility of peeling from the die paddle 114. In other words, the adhesive layer 130 can form downward-extending portions 132 within the corresponding recesses 116 to enhance the fixation. The downward-extending portions 132 of the adhesive layer 130 are located under and around the III-nitride-based die 140 to let the III-nitride-based die 140 attached on the die paddle 114.

The bonding wires 160 can be disposed to electrically connect the III-nitride-based die 140 to the lead 112. In this regard, the III-nitride-based die 140 can have electrical connection points facing away from the top surface ST of the die paddle 114. In some embodiments, the bottom-most surface of the III-nitride-based die 140 is an electrical insulator.

Thereafter, the encapsulant 150 can be formed by driving an encapsulant compound, causing it to flow on the top surface ST of the die paddle 114 and then curing (i.e., solidifying, hardening, or heating) the encapsulant compound. After the curing, the encapsulant 150 can encapsulate the lead frame 110 and the III-nitride-based die 140. Also, the bonding wires 160 are encapsulated by the encapsulant 150. In some embodiments, the encapsulant compound can include epoxy, fillers, particles, and combinations thereof. In practical cases, the encapsulant 150 may be selected from a molding compound.

The recesses 118 are round and thus are suitable for receiving the liquid encapsulant compound in flowing. One of the reasons is that the recesses 118 have horizontal cross-sectional areas that gradually decrease in a depth direction, which will be advantageous to let a liquid fluid flow in. Moreover, the rounded corner of the recesses 118 can avoid an air bubble resulting from the liquid encapsulant compound in flowing. Accordingly, the encapsulant 150 can have a large contact area with the die paddle 114 and thus can be strongly attached to the die paddle 114, which reduces the possibility of peeling from the die paddle 114.

The encapsulant 150 can form downward-extending portions 152 within the corresponding recesses 118 to enhance the fixation. The downward-extending portions 152 of the encapsulant 150 are located around the III-nitride-based die 140, such that the encapsulant 150 can encapsulate the III-nitride-based die 140 on the die paddle 114 well. Furthermore, as the recesses 116 and 118 have different horizontal cross-sectional areas, the downward-extending portions 132 and 152 of the adhesive layer 130 and the encapsulant 150 can have different end profiles. The end profile of each of the downward-extending portions 132 of the adhesive layer 130 is rectangular. The end profile of each of the downward-extending portions 152 of the encapsulant 150 is trapezoid.

In some embodiments, the III-nitride-based die 140 may include at least one III-nitride-based transistor therein. Herein, the III-nitride-based transistor can include two nitride-based semiconductor layers which can serve a channel layer and a barrier layer, two or more source/drain (S/D) electrodes, and at least one gate electrode. The exemplary materials of the nitride-based semiconductor layers can include, for example but are not limited to, nitrides or group III-nitrides, such as GaN, AlN, InN, $In_xAl_yGa_{(1-x-y)}N$ where $x+y \le 1$, $Al_yGa_{(1-y)}N$ where $y \le 1$. The exemplary materials of the nitride-based semiconductor layers are selected such that the upper nitride-based semiconductor layer has a bandgap (i.e., forbidden band width) greater than a bandgap of the lower nitride-based semiconductor layer, which causes electron affinities thereof different from each other and forms a heterojunction therebetween. For example, when the lower nitride-based semiconductor layer is an undoped GaN layer having bandgap of approximately 3.4 eV, the upper nitride-based semiconductor layer can be selected as an AlGaN layer having bandgap of approximately 4.0 eV. A triangular well potential is generated at a bonded interface between the channel and barrier layers, so that electrons accumulate in the triangular well potential, thereby generating a two-dimensional electron gas (2DEG) region adjacent to the heterojunction. The S/D electrodes and the gate electrode can be disposed above the 2DEG. Accordingly, the III-nitride-based die 140 is available to include at least one GaN-based high-electron-mobility transistor (HEMT).

In addition to the increased bonding strength, the increased surface area created by the recesses 116 and 118 enhances thermal dissipation from the III-nitride-based die 140. The III-nitride-based die 140 can have at least one III-nitride-based transistor; such devices operate both at increased switching frequency and higher power per unit area than silicon devices. As a result, III-V devices may have a greater need for heat dissipation than prior art semiconductor devices, for example, silicon-based devices or GaAs-based devices. The package of FIGS. 1A and 1B is thus customized for the specific needs of III-nitride based semiconductor devices and assists in thermal dissipation, reducing delamination of encapsulant from the die paddle.

In some embodiments, the recesses 116 and 118 can be formed by a single stamping process. For example, the die paddle 114 can be placed into a stamping press, and a tool downward presses the die paddle 114 to form the recesses with desired shapes. To simplify the stamping process, the recesses 116 and 118 can be formed without connecting each other. Moreover, to simplify the stamping process, the recesses 116 and 118 can be arranged to form an array having M rows and N columns, in which M and N are positive integers. For example, in the exemplary illustration of FIG. 1A, the recesses 116 and 118 can collectively form 12 rows and 12 columns.

Figure 2A:
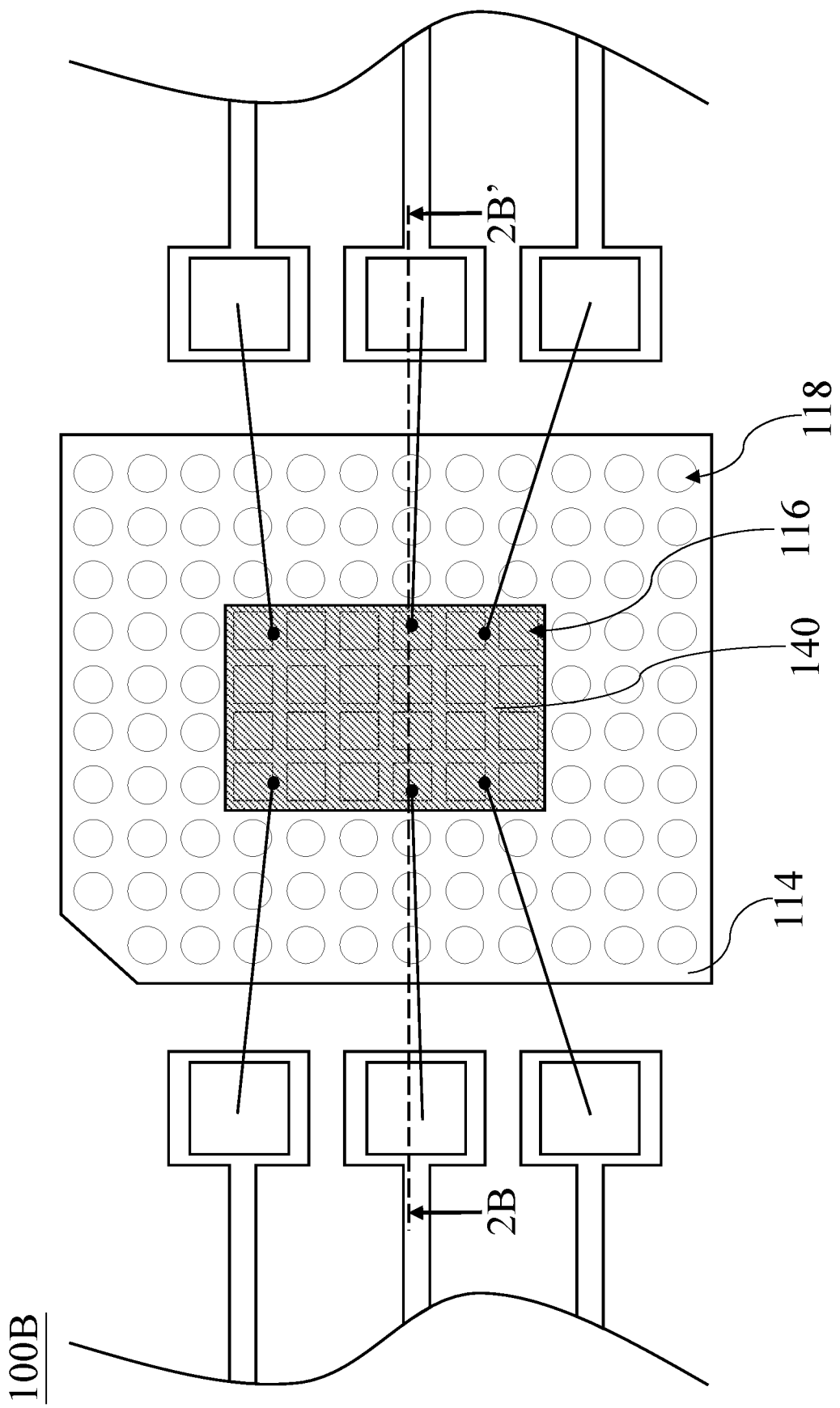
FIG. 2A is a top view of a III-nitride-based semiconductor packaged structure according to some embodiments of the present disclosure.
Figure 2B:
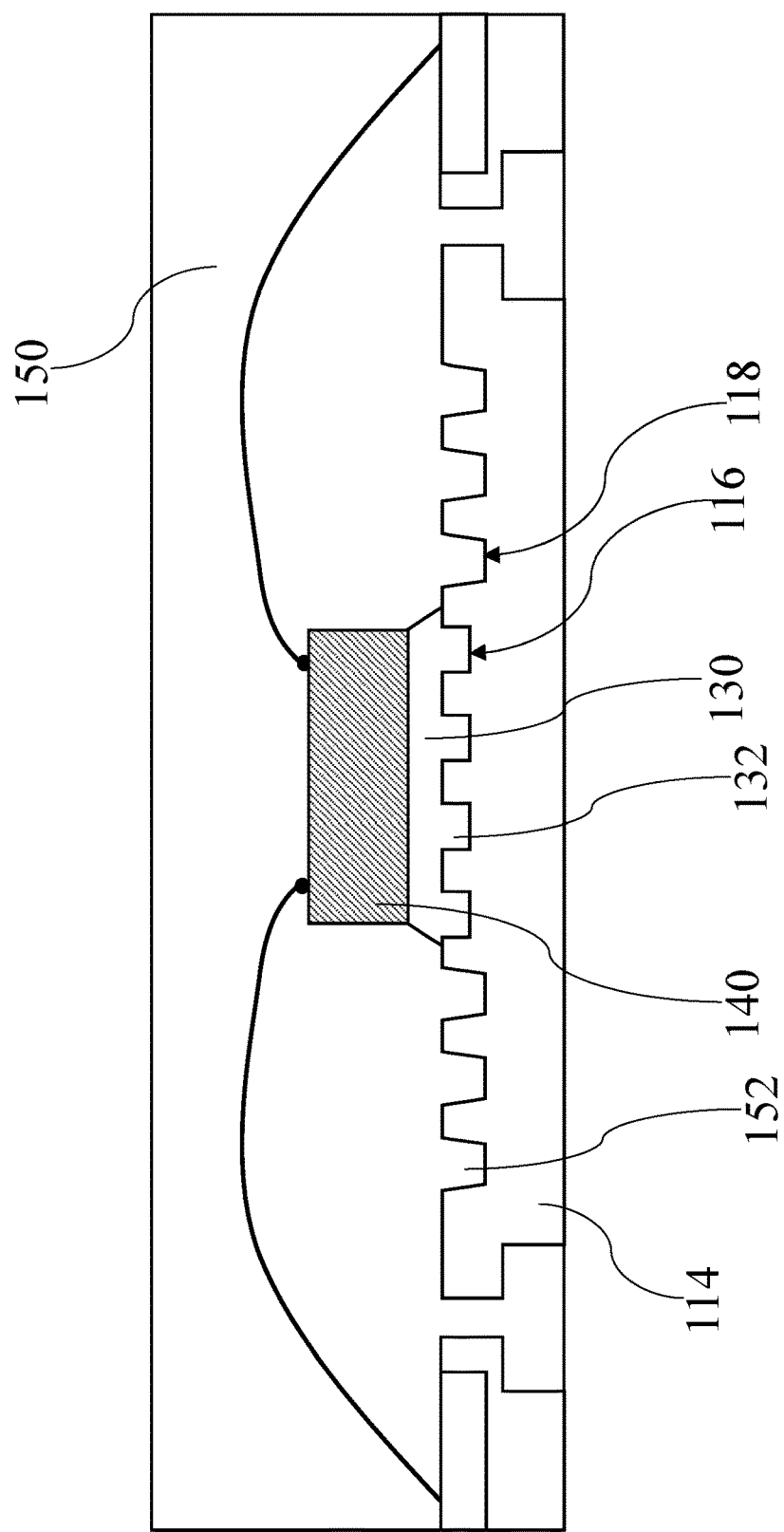
FIG. 2B is a cross-sectional view across a line 2B-2B' of the semiconductor device in FIG. 2A.

FIG. 2A is a top view of a III-nitride-based semiconductor packaged structure 100B according to some embodiments of the present disclosure. FIG. 2B is a cross-sectional view across a line 2B-2B' of the semiconductor device 200A in FIG. 2A. In the present embodiment, the distribution of the recesses 116 can be designed as aligning with the adhesive layer 130. With this configuration, the difference between the recesses 116 and 118 can be further made for different requirements or manufacturing conditions.

For example, since all of the recesses 116 are filled with the adhesive layer 130, the design of the recesses 116 can exclude the concern of the property of the liquid encapsulant compound, such as the viscosity of the liquid encapsulant compound. Therefore, it can further avoid peeling of the adhesive layer 130 or the encapsulant 150 from the die paddle 114. Correspondingly, all of the recesses 116 are filled with the adhesive layer 130. All of the recesses 118 are filled with the encapsulant 150.

Furthermore, as shown in FIG. 2B, the recesses 116 and 118 can have different depths. In the exemplary illustration of FIG. 2B, the recesses 118 are deeper than the recess 116, which further makes the encapsulant 150 attached to the die paddle 114 due to the greater contact area. In other embodiments, the recesses 116 are deeper than the recess 118. For example, as concerned with the heat dispassion issues, the recesses 116 can be deeper than the recess 118, such that the heat transferred from the III-nitride-based die 140 to the adhesive layer 130 can be effectively conducted to the die paddle 114.

As the recesses 116 and 118 have different horizontal cross-sectional areas, the downward-extending portions 132 and 152 of the adhesive layer 130 and the encapsulant 150 can have extending heights. In the exemplary illustration of FIG. 2B, the extending height of each of the downward-extending portions 132 of the adhesive layer 130 is less than the extending height of each of the downward-extending portions 152 of the encapsulant 150.

Figure 3A:
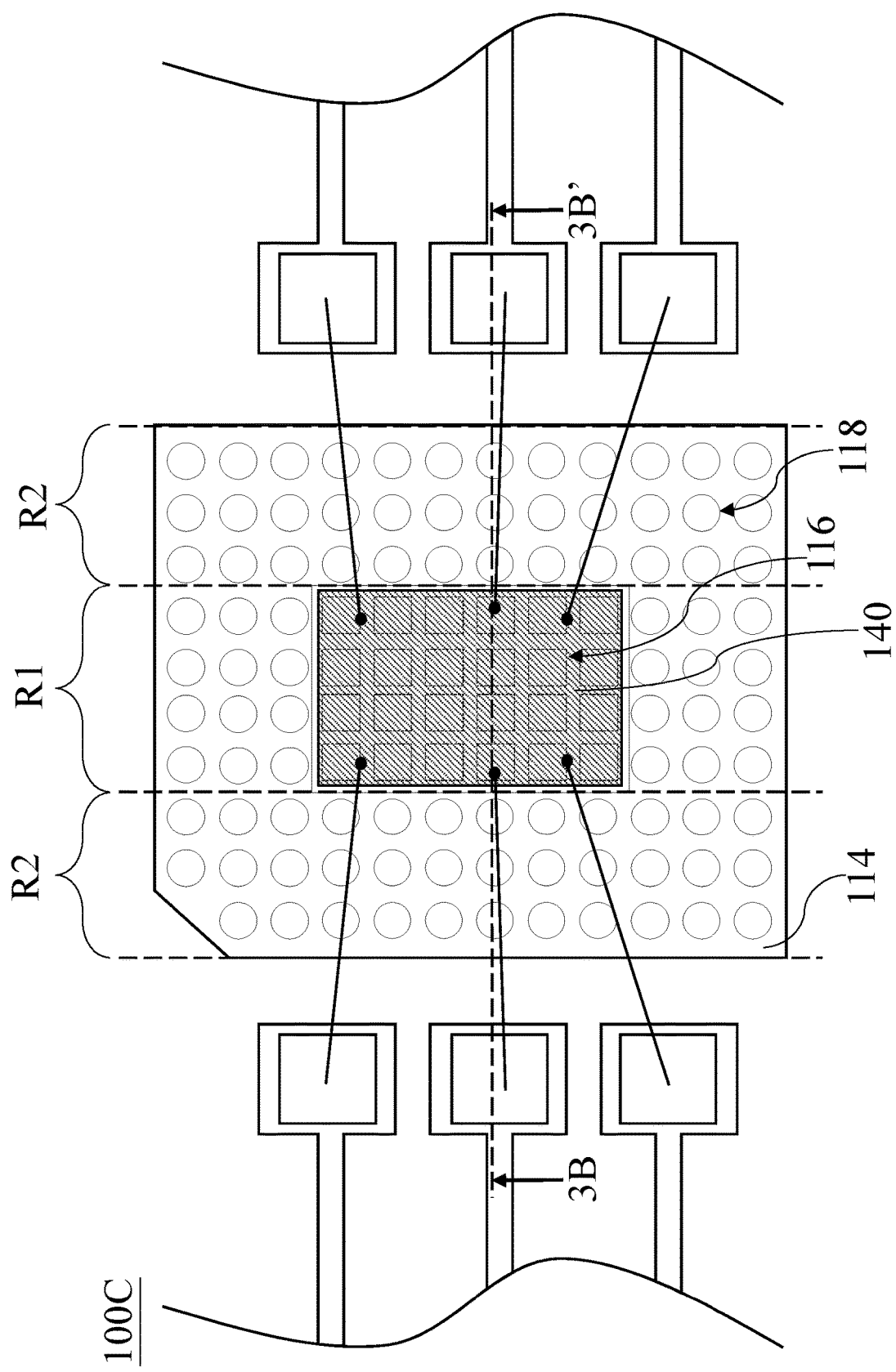
FIG. 3A is a top view of a III-nitride-based semiconductor packaged structure according to some embodiments of the present disclosure.
Figure 3B:
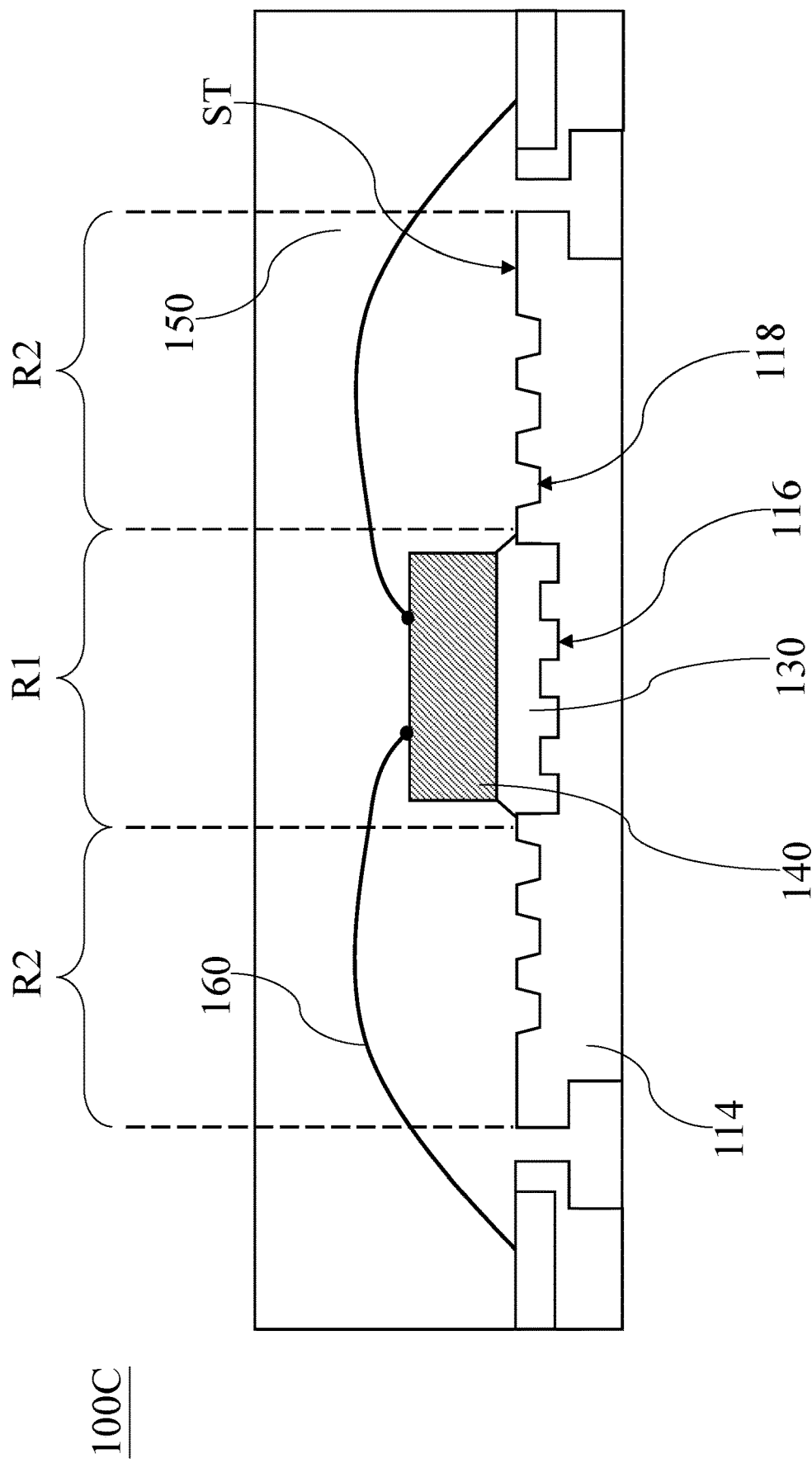
FIG. 3B is a cross-sectional view across a line 3B-3B' of the semiconductor device in FIG. 3A.

FIG. 3A is a top view of a III-nitride-based semiconductor packaged structure 100C according to some embodiments of the present disclosure. FIG. 3B is a cross-sectional view across a line 3B-3B' of the semiconductor device 100C in FIG. 3A. In the present embodiment, within the top surface ST of the die paddle 114, the relatively central region R1 is elevationally different from the relatively peripheral region R2. More specifically, the relatively central region R1 is elevationally lower than the relatively peripheral region R2. That is, with respect to a bottom of the die paddle 114, the height of the relatively central region R1 is less than the height of the relatively peripheral region R2. Correspondingly, a bottom of each of the recesses 116 can be elevationally different from a bottom of each the recesses 118 as well.

In the exemplary illustration of FIG. 3B, the bottom of each of the recesses 116 is elevationally lower than the bottom of each the recesses 118. With such configuration, the vertical position of the III-nitride-based die 140 can be lowered, so as to thin a combination of the die paddle 114, the adhesive layer 130, and the III-nitride-based die 140.

Since the III-nitride-based die 140 can have at least one III-nitride-based transistor therein, the III-nitride-based die 140 can be formed with a reduced thickness. Herein, the term "reduced thickness" is relative to other types of transistors (e.g., silicon-based devices). Therefore, with lowering the relatively central region R1 to make it elevationally less than the relatively peripheral region R2, the packaged structure can be formed thinner. This is advantageous for applications in portable personal electronics, such as 5G handsets.

Figure 4A:
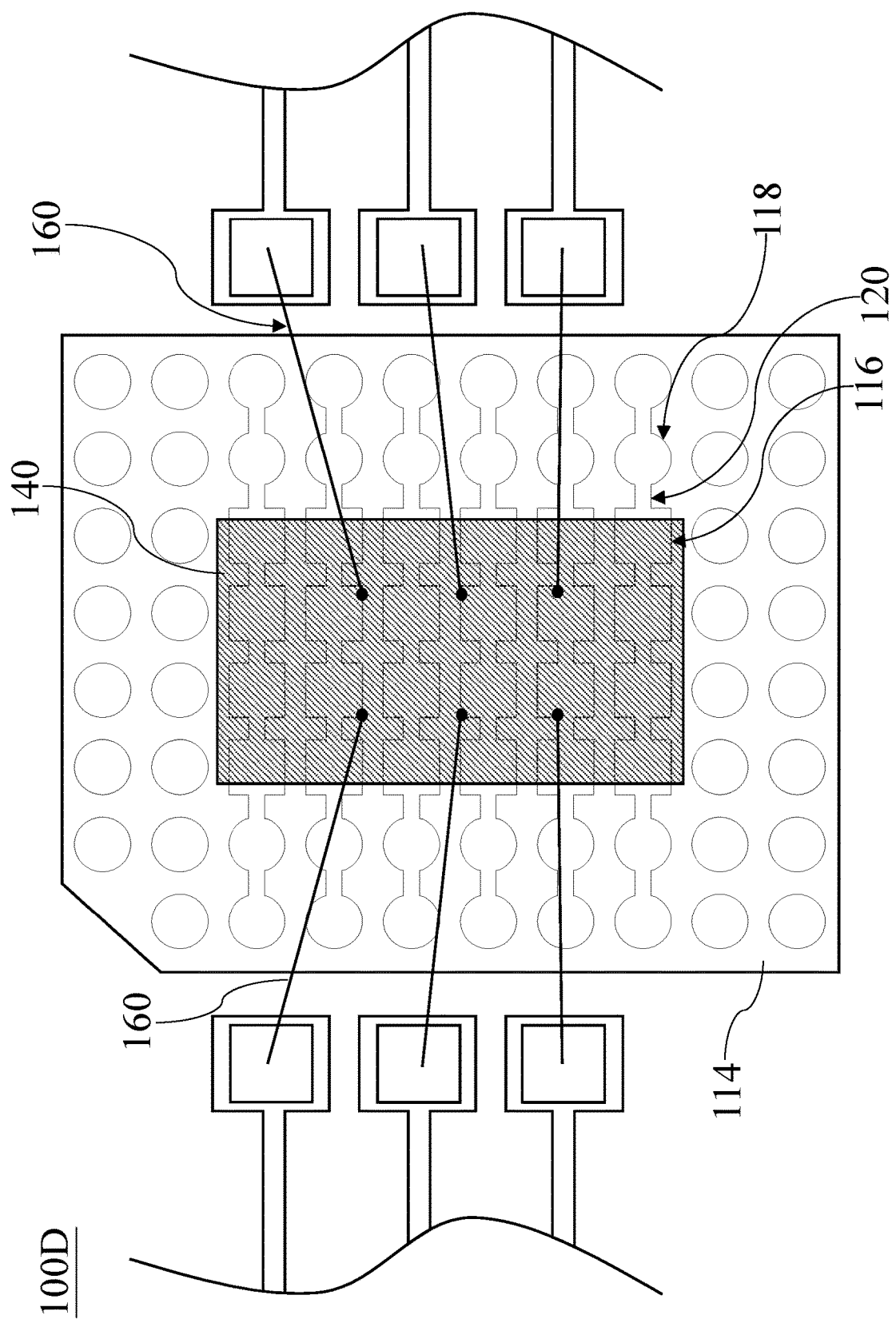
FIG. 4A is a top view of a III-nitride-based semiconductor packaged structure according to some embodiments of the present disclosure.

FIG. 4A is a top view of a III-nitride-based semiconductor packaged structure 100D according to some embodiments of the present disclosure. In the present embodiment, the die paddle 114 can further have recesses 120 to connect the recesses 116 and 118. The recesses 120 can connect the recesses 116 and 118 disposed at a same line. More specifically, the recesses 116 and 118 located at the same horizontal line can be connected by the recesses 120, as shown at the 3th to 8th rows. The recesses 116 and 118 at different rows are without connecting still. Furthermore, a vertical projection of at least one of the bonding wires 160 on the die paddle 114 falls within the corresponding recess 120. The III-nitride-based die 140 can cover some of the recesses 120. Such configuration is made for reducing some unexpected events during the packaging stage.

Figure 4B:
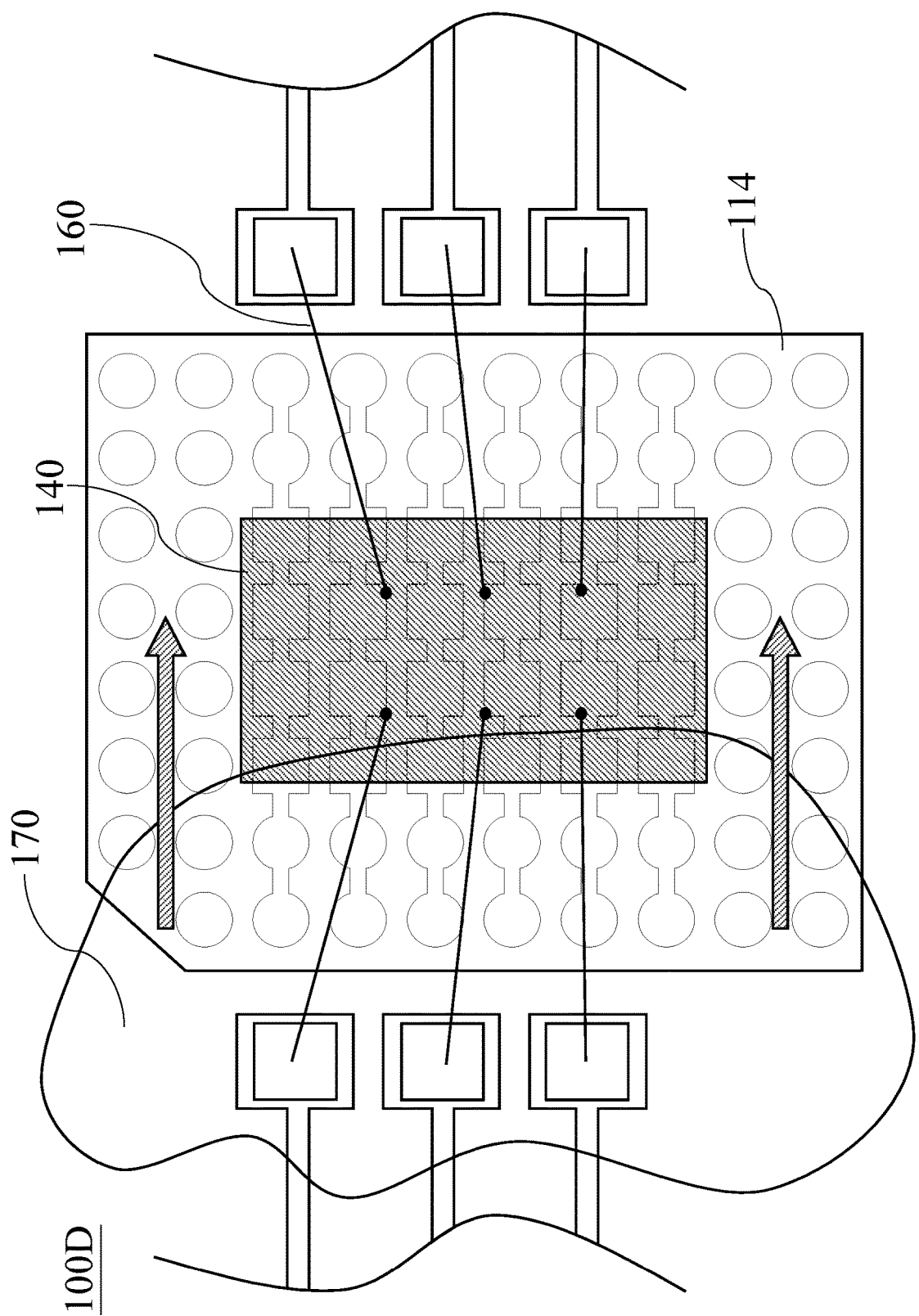
FIG. 4B is a top view of a III-nitride-based semiconductor packaged structure during a package stage according to some embodiments of the present disclosure.

FIG. 4B is a top view of a III-nitride-based semiconductor packaged structure 100D during a package stage according to some embodiments of the present disclosure. As aforedescribed, an encapsulant can be formed by driving an encapsulant compound (e.g., pressure from extrusion), causing it to flow on a die paddle and then curing it. As shown in FIG. 4B, a liquid encapsulant compound 170 can be driven to flow from a side of the die paddle 114 toward another side, as indicated by the arrows.

During a packaging stage, a III-nitride-based die or a bonding wire may be impacted by a fluid flow of a liquid encapsulant compound and thus would be displaced, which makes the packaging stage fail.

When the liquid encapsulant compound 170 flows on the die paddle 114, the recesses 120 can serve as buffer recesses to guide the fluid flowing of the liquid encapsulant compound 170. For example, the liquid encapsulant compound 170 can flow from the recesses 116 to the recesses 118 via the recesses 120, and vice versa. Once one of the recesses 116 is fully filled with the liquid encapsulant compound 170, the liquid encapsulant compound 170 can continuously flow into the corresponding recess 118 via the recess 120, instead of overflowing from this recess 116, so as to reduce the upward impact of the liquid encapsulant compound 170. As such, even if the liquid encapsulant compound 170 impacts the die paddle 114 or the bonding wires 160, the impact strength can be reduced, so as to improve the yield rate of the packaging stage. During the packaging stage, the recesses 120 can be filled with the liquid encapsulant compound 170. After curing (i.e., solidifying, hardening, or heating) the liquid encapsulant compound 170, the recesses 120 can be filled with the encapsulant.

Figure 5A:
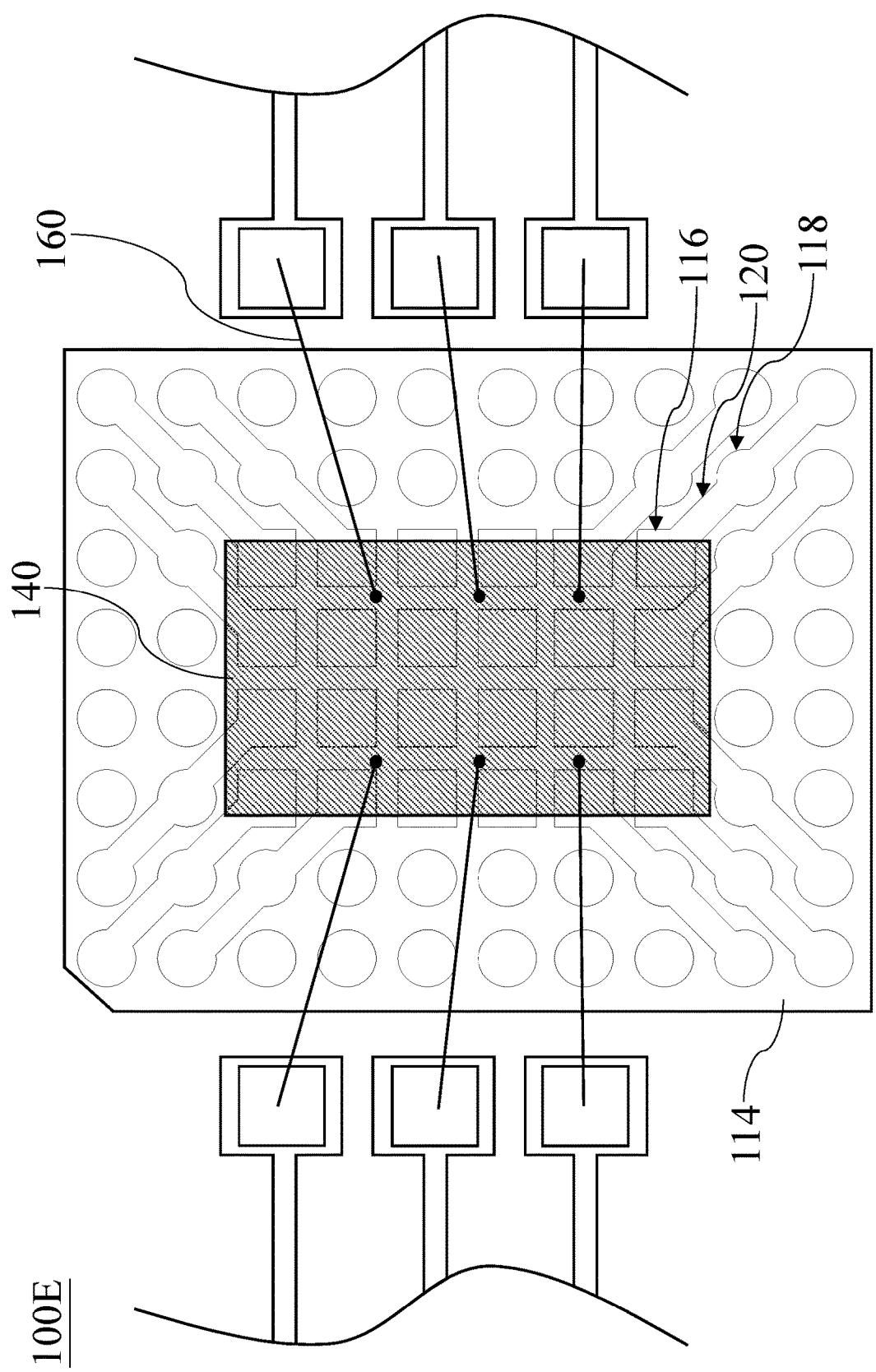
FIG. 5A is a top view of a III-nitride-based semiconductor packaged structure according to some embodiments of the present disclosure; and Referring to FIG. 5B, which is a top view of a III-nitride-based semiconductor packaged structure during a package stage according to some embodiments of the present disclosure.

FIG. 5A is a top view of a III-nitride-based semiconductor packaged structure 100E according to some embodiments of the present disclosure. In the present embodiment, the die paddle 114 can further have recesses 120 to connect the recesses 116 and 118. The recesses 120 can connect the recesses 116 and 118 at different horizontal and vertical locations. More specifically, the recesses 116 and 118 can be arranged to form an array having M rows and N columns, in which M and N are positive integers. For example, in the exemplary illustration of FIG. 5A, the recesses 116 and 118 can collectively form an array having 10 rows and 8 columns. The recesses 120 can connect the recesses 116 and 118 which are disposed at different rows and different columns. Similarly, such configuration is made for reducing some unexpected events during the package stage.

Figure 5B:
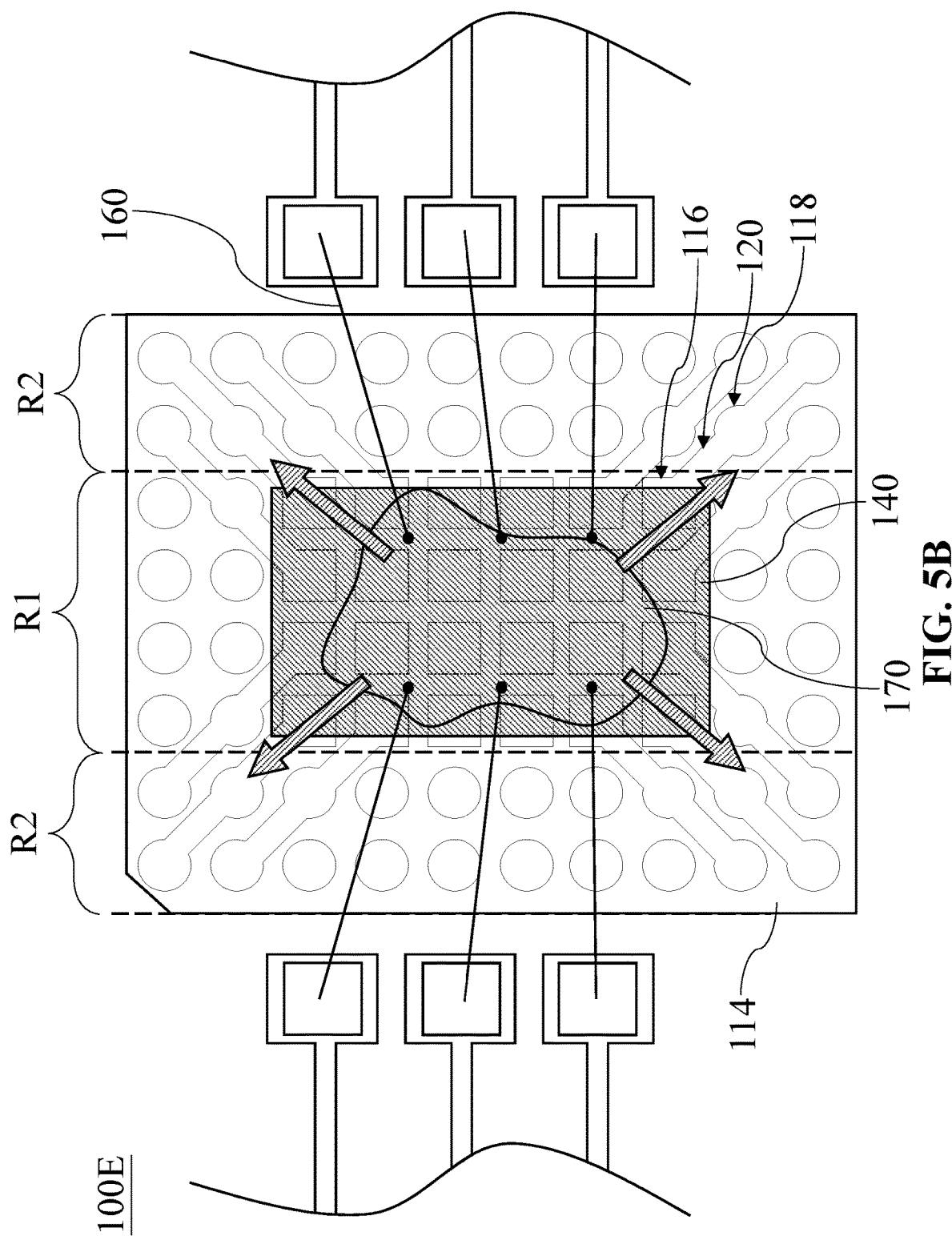

Referring to FIG. 5B, which is a top view of a III-nitride-based semiconductor packaged structure 100E during a packaging stage according to some embodiments of the present disclosure, a liquid encapsulant compound 170 can be driven to flow from the relatively central region R1 of the die paddle 114 toward the relatively peripheral region R2, as indicated by the arrows.

When the liquid encapsulant compound 170 divergently flows on the die paddle 114, the recesses 120 can serve as buffer recesses to guide the fluid flowing of the liquid encapsulant compound 170. For example, the liquid encapsulant compound 170 can flow from the recesses 116 to the recess 118 via the recess 120, and vice versa. As such, the impact from the liquid encapsulant compound 170 on the die paddle 114 or the bonding wires 160 is reduced, so as to improve the yield rate of the packaging stage. During the packaging stage, the recesses 120 can be filled with the liquid encapsulant compound 170. After curing (i.e., solidifying, hardening, or heating) the liquid encapsulant compound 170, the recesses 120 can be filled with the encapsulant.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about"

are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A III-nitride-based semiconductor packaged structure, comprising:
a lead frame comprising a die paddle and at least one lead, wherein the die paddle has a plurality of first recesses and a plurality of second recesses arranged in a top surface of the die paddle, and a third recess to connect the first and second recesses, the first recesses are located adjacent to a relatively central region of the top surface, the second recesses are located adjacent to a relatively peripheral region of the top surface, and the first recess has a shape different from the second recess from a top-view perspective;
an adhesive layer disposed on the die paddle to fill into at least one of the first recesses;
a III-nitride-based die disposed on the adhesive layer;
an encapsulant encapsulating the lead frame and the III-nitride-based die, wherein at least one of the second recesses is filled with the encapsulant; and
at least one bonding wire encapsulated by the encapsulant and electrically connecting the III-nitride-based die to the lead.

2. The III-nitride-based semiconductor packaged structure of claim 1, wherein a first group of the first recesses is filled with the adhesive layer, and a second group of the first recesses is filled with the encapsulant.

3. The III-nitride-based semiconductor packaged structure of claim 1, wherein all of the second recesses are filled with the encapsulant.

4. The III-nitride-based semiconductor packaged structure of claim 3, wherein all of the first recesses are filled with the adhesive layer.

5. The III-nitride-based semiconductor packaged structure of claim 1, wherein the shape of each of the first recesses is rectangular, and the shape of each of the second recesses is round.

6. The III-nitride-based semiconductor packaged structure of claim 1, wherein a bottom of at least one of the first recesses is elevationally different from a bottom of at least one of the second recesses.

7. The III-nitride-based semiconductor packaged structure of claim 6, wherein the bottom of at least one of the first recesses is elevationally less than the bottom of at least one of the second recesses.

8. The III-nitride-based semiconductor packaged structure of claim 1, wherein the second recesses are arranged to surround the first recesses without connecting the first recesses.

9. The III-nitride-based semiconductor packaged structure of claim 1, wherein the third recess connects the first and second recesses disposed at a same line.

10. The III-nitride-based semiconductor packaged structure of claim 9, wherein a vertical projection of the bonding wire falls within the third recess.

11. The III-nitride-based semiconductor packaged structure of claim 1, wherein the first and second recesses are arranged to form an array having M rows and N columns, and the third recess connects the first and second recesses which are disposed at different rows and different columns.

12. The III-nitride-based semiconductor packaged structure of claim 1, wherein the third recess is filled with the encapsulant.

13. The III-nitride-based semiconductor packaged structure of claim 1, wherein the III-nitride-based die covers the third recess.

14. The III-nitride-based semiconductor packaged structure of claim 1, wherein the first and second recesses have different depths.

15. The III-nitride-based semiconductor packaged structure of claim 1, wherein the III-nitride-based die comprises at least one III-nitride-based transistor therein.

16. A method for manufacturing a III-nitride-based semiconductor packaged structure, comprising:
forming a plurality of first recesses into a relatively central region of a die paddle;

forming a plurality of second recesses into a relatively peripheral region of the die paddle, wherein the first and second recesses have different shapes from a top-view perspective;

forming a third recess to connect some of the first and second recesses;

filling at least one of the first recesses with an adhesive layer;

disposing a III-nitride-based die on the adhesive layer;

disposing a bonding wire to electrically connect the III-nitride-based die to a lead; and encapsulating the die paddle, the lead, and the III-nitride-based die, so as to fill at least one of the first recesses with an encapsulant.

17. The method of claim 16, wherein the first and second recesses are formed by a single stamping process.

18. The method of claim 16, wherein forming the encapsulant comprises:

driving the encapsulant compound to flows from the first recess to the second recess via the third recess, and vice versa; and curing the encapsulant compound.

* * * * *